United States Patent
Lee

(10) Patent No.: US 6,937,733 B2
(45) Date of Patent: Aug. 30, 2005

(54) AUDIO SYSTEM WITH A PHASE ADJUSTMENT CIRCUIT

(75) Inventor: Hee-Tae Lee, Kyungki-Do (KR)

(73) Assignee: Hyundai Motor Company, Seoul (KR)

(*) Notice: Subject to any disclaimer, the term of this patent is extended or adjusted under 35 U.S.C. 154(b) by 293 days.

(21) Appl. No.: 10/269,701

(22) Filed: Oct. 11, 2002

(65) Prior Publication Data

US 2003/0086577 A1 May 8, 2003

(30) Foreign Application Priority Data

Oct. 11, 2001 (KR) .................................. 2001-62600

(51) Int. Cl.[7] .............................................. H03G 5/00
(52) U.S. Cl. ........................................ 381/103; 381/86
(58) Field of Search ............................... 381/1, 303, 97, 381/98, 101, 102, 104, 107, 109, 86; 333/28 T, 28 R

(56) References Cited

U.S. PATENT DOCUMENTS

| | | | |
|---|---|---|---|
| 4,292,467 A | * | 9/1981 | Odlen et al. .................... 381/1 |
| 4,329,544 A | | 5/1982 | Yamada |
| 4,594,729 A | | 6/1986 | Weingartner |
| 4,622,691 A | | 11/1986 | Tokumo et al. |
| 4,648,117 A | | 3/1987 | Kunugi et al. |
| 4,864,246 A | | 9/1989 | Kato et al. |
| 4,972,489 A | | 11/1990 | Oki et al. |
| 5,018,205 A | | 5/1991 | Takagi et al. |
| 5,023,914 A | | 6/1991 | Arnold |
| 5,073,944 A | | 12/1991 | Hirasa |

FOREIGN PATENT DOCUMENTS

| | | |
|---|---|---|
| EP | 1 052 877 A2 | 11/2000 |
| EP | 1 056 310 A2 | 11/2000 |

* cited by examiner

*Primary Examiner*—Ping Lee
(74) *Attorney, Agent, or Firm*—Morgan Lewis & Bockius LLP

(57) ABSTRACT

An audio system is disclosed in which offset phenomenon caused by a phase difference between the reproduced audio signals of front speakers and rear speakers is prevented. In the system a plurality of equalizers compensate the frequency characteristics of the output signals of a volume controller. A power amplifier amplifies the power of the output signals. A phase adjusting circuit divides at least one or more sets of the audio signals into a plurality of frequency bands when the audio signals are inputted from a volume controller to the plurality of the equalizers, and adjusts the phase of at least one or more sets of the audio signals among the divided audio signals. Accordingly, phase interferences are prevented between the audio signal sets of the front speakers and the rear speakers, and therefore, the audio signals of the low frequency bands can be boosted in a natural manner.

4 Claims, 2 Drawing Sheets

AUDIO SYSTEM WITH A PHASE ADJUSTMENT CIRCUIT

FIELD OF THE INVENTION

The present invention relates to a car audio system, and more particularly, to a car audio system with a phase adjustment circuit that prevents offsetting of audio signals.

BACKGROUND OF THE INVENTION

A conventional car audio system typically includes a microprocessor, a tuner, a tape or CD player, an equalizer, a power amplifier and speakers. The microcomputer controls the audio system in accordance with user's manipulations. The equalizer compensates for frequency characteristics of the output audio signals as desired by the user. A typical equalizer includes a first equalizer connected to a front right speaker, a second equalizer connected to a front left speaker, a third equalizer connected to a rear right speaker, and a fourth equalizer connected to a rear left speaker.

In conventional car audio systems, however, the reproduced acoustic phases of the respective speakers within the car are different from each other, thereby causing offsets. For example, a phase inversion occurs between the reproduced sounds of the front speakers and the rear speakers of the car. Due to this phenomenon, a sound offset occurs to a severe degree. Particularly, in a frequency band of less than 100 Hz, the sound offset phenomenon is most problematic. Further, due to the sound offset phenomenon, the user tends to forcibly boost the audio signals in a frequency band of less than 100 Hz through the equalizers. As a result, the audio signals are distorted, degrading the sound quality and causing vibration in the car body panel.

SUMMARY OF THE INVENTION

The present invention provides an audio system in which the offset phenomenon caused by the phase difference between the reproduced audio signals of the front speakers and the rear speakers is prevented. In accordance with an embodiment of the present invention, there is provided an audio system comprising a volume control means for adjusting the volume of the output signals of a tuner/deck. A plurality of equalizers compensates the frequency characteristics of the output signals of the volume control means. A power amplifier amplifies the power of output signals at the plurality of the equalizers to output them to speakers. A phase adjusting means divides at least one set or more sets of the audio signals into a plurality of frequency bands when the audio signals are input from the volume control means to the plurality of the equalizers, and adjusts the phase of at least one set or more sets of the audio signals among the divided audio signals.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Hereinafter, the preferred embodiments of the present invention will be described in detail referring to the attached drawings.

Figure 1:
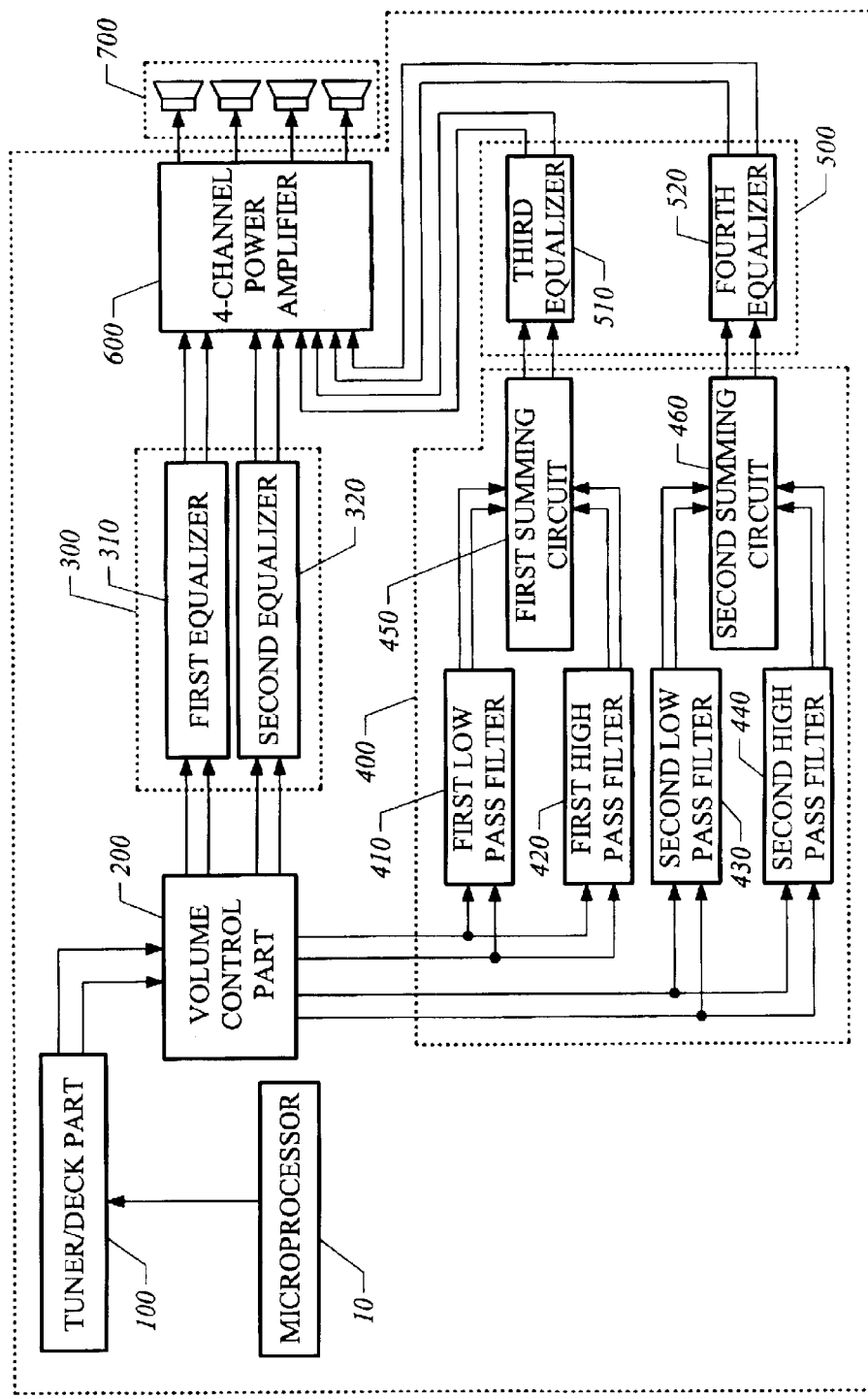
FIG. 1 is a block diagram showing the constitution of the car audio system according to the present invention.

As shown in FIG. 1, If the user turns on the power to activate the car audio system, a microcomputer 10 operates in accordance with a program which has been stored in advance. That is, the microcomputer 10 outputs control signals for selectively activating the elements such as a tuner or a deck as selected by the user. Through tuner/deck part 100, activated by the control signals of the microcomputer 10, radio signals are received and demodulated, or the audio signals of a compact disc or a tape are reproduced and outputted.

In accordance with user manipulations, a volume control part 200 adjusts the volume of the audio signals such as the bass, treble, fade and balance, to output them through four channels separately. An equalizer 300 for front speakers includes a first equalizer 310 for the front right speaker and a second equalizer 320 for the front left speaker. Thus the equalizer 300 for the front speakers compensates the frequency characteristics of the output audio signals from the volume control part 200. Audio signals that have been output from the equalizer 300 for the front speakers are subject to power amplification at a 4-channel power amplifier 600, and are reproduced at speakers 700.

A phase adjusting part 400 prevents the offset phenomenon, which is caused by phase inversion of the audio signals depending on the car interior conditions and speaker installation conditions at a predetermined frequency zone (typically less than 100 Hz). The phase adjusting part 400 includes a first and second low pass filter 410 and 430, a first and second high pass filter 420 and 440, and a first and second summing circuit 450 and 460. First summary circuit 450 inverts the polarity of the output audio signals of the first low pass filter 410 to add these audio signals to the output signals of the first high pass filter 420 so as to output these added signals through a third equalizer 510 and the power amplifier 600 to the rear right speaker of the car. Second summing circuit 460 inverts the polarity of the output audio signals of the second low pass filter 430 to add these audio signals to the output audio signals of the second high pass filter 440 so as to output these added signals through a fourth equalizer 520 and the power amplifier 600 to the rear left speaker of the car.

Figure 2:
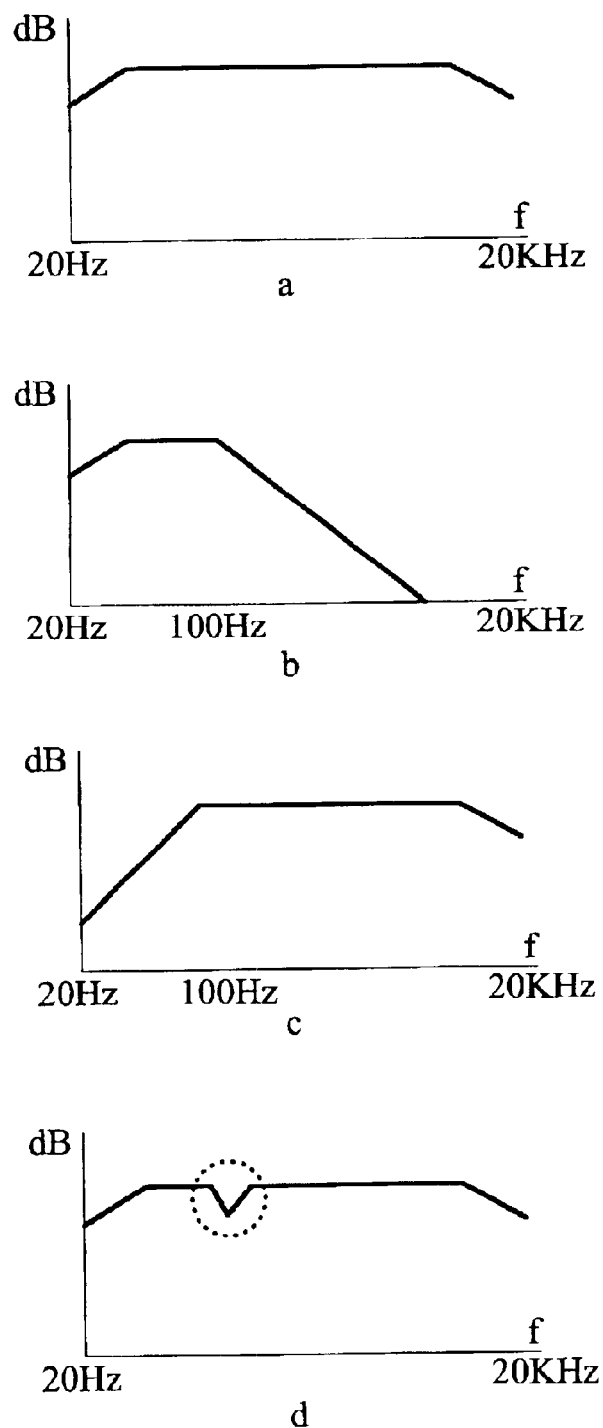
FIG. 2 is a graphical illustration showing the frequency characteristics of the phase adjusting circuit according to the present invention.

The audio signals as shown in FIG. 2a are output from the volume control part 200 to pass through the first and second low pass filters 410 and 430 and the first and second high pass filters 420 and 440. Then the audio signals are divided into frequency bands of under 100 Hz and over 100 Hz as shown in FIGS. 2b and 2c, respectively. As described above, the audio signals that have passed through the first and second low pass filters 410 and 430 and the first and second high pass filters 420 and 440 are combined together by the first and second summing circuits 450 and 460, respectively, to output the audio signals as shown in FIG. 2d.

The audio signals that have passed through the first and second low pass filters 410 and 430, to be inputted into the first and second summing circuits 450 and 460, are subjected to a polarity inversion. In order to realize this, a separate phase inverting means may be used, but in the present invention, the phase inversion is carried out in the following manner. That is, the positive audio signal lines and the negative audio signal lines which are connected between the low pass filters and the summing circuits are connected in the opposite form, thereby inverting the phase.

Even if the polarities of the audio signals that have passed through the low pass filters are inverted to be added to the output audio signals of the high pass filters, a slight offset phenomenon occurs due to the phase difference between the audio signals near the frequency zone of 100 Hz, thereby degrading the sound pressure. However, the slight offset can be overcome by adjusting the equalizer 300 for the front speakers.

As shown in FIG. 1, the signals which have been summed up by the first summing circuit 450 and the second summing circuit 460 are outputted after being compensated to the user's desired frequency characteristics by the third and fourth equalizers 510 and 520 for the rear right and left speakers. The audio signals which have been compensated by the equalizer 500 for the rear right and left speakers are amplified by the power amplifier 600 shown in FIG. 1, and are reproduced at the speakers 700.

According to the present invention as described above, phase interferences between the audio signal sets of the front speakers and the rear speakers of the car are prevented, and therefore, the audio signals of low frequency bands can be boosted in a natural manner. Accordingly, the present invention prevents distortion of audio signals and vibration of the car body panel, which occur when forcibly boosting the audio signals of low frequency bands at the equalizer.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An audio system, comprising:
    a volume control means for adjusting the volume of output signals of a tuner or deck;
    a plurality of equalizers compensating for frequency characteristics of output signals of the volume control means;
    a power amplifier amplifying the power of output signals of the plurality of the equalizers to transmit to speakers; and
    a phase adjusting means for dividing at least one or more sets of the audio signals into a plurality of frequency bands when said audio signals are inputted from said volume control means to the plurality of the equalizers, and for adjusting the phase of at least one or more sets of said audio signals among the divided audio signals, wherein the phase adjusting means comprises:
    low pass filters removing audio signals of frequency bands higher than a reference frequency from the output audio signals of said volume control means;
    high pass filters removing audio signals of frequency bands lower than the reference frequency from the output audio signals of said volume control means; and
    summing circuits adding together output audio signals of the low pass filters and the high pass filters.

2. The audio system as claimed in claim 1, wherein the reference frequency is 100 Hz.

3. An audio system, comprising:
    a volume control means for adjusting the volume of output signals of a tuner or deck;
    a plurality of equalizers compensating for frequency characteristics of output signals of the volume control means;
    a power amplifier amplifying the power of output signals of the plurality of the equalizers to transmit to speakers; and
    a phase adjusting means for dividing at least one or more sets of the audio signals into a plurality of frequency bands when said audio signals are inputted from said volume control means to the plurality of the equalizers, and for adjusting the phase of at least one or more sets of said audio signals among the divided audio signals, wherein said phase adjusting means comprises:
    first and second low pass filters removing audio signals of frequency bands higher than a reference frequency from the output audio signals of said volume control means;
    first and second high pass filters removing audio signals of frequency bands lower than the reference frequency from the output audio signals of said volume control means;
    a first summing circuit inverting a polarity of the output audio signals of the first low pass filter to combine with audio signals to the output signals of the first high pass filter so as to be transmitted to a rear right speaker of a car through the equalizers and the power amplifier; and
    a second summing circuit inverting a polarity of the output audio signals of the second low pass filter to add with audio signals to the output audio signals of the second high pass filter so as to transmit to a rear left speaker of the car through the equalizers and the power amplifier.

4. An audio system, comprising:
    a volume control means for adjusting the volume of output signals of a tuner or deck;
    a plurality of equalizers compensating for frequency characteristics of output signals of the volume control means;
    a power amplifier amplifying the power of output signals of the plurality of the equalizers to transmit to speakers; and
    a phase adjusting means for dividing at least one or more sets of the audio signals into a plurality of frequency bands when said audio signals are inputted from said volume control means to the plurality of the equalizers, and for adjusting the phase of at least one or more sets of said audio signals among the divided audio signals, wherein said phase adjusting means divides at least one or more sets of the audio signals inputted from said volume control means into the plurality of the equalizers based on a reference frequency, and inverts the polarities of any one of the sets of the divided audio signals.

* * * * *